United States Patent
Zeng et al.

(10) Patent No.: US 8,572,463 B2
(45) Date of Patent: Oct. 29, 2013

(54) QUASI-CYCLIC LDPC ENCODING AND DECODING FOR NON-INTEGER MULTIPLES OF CIRCULANT SIZE

(75) Inventors: Lingqi Zeng, San Jose, CA (US); Yu Kou, San Jose, CA (US); Kin Man Ng, Cupertino, CA (US); Kwok W. Yeung, Milpitas, CA (US)

(73) Assignee: SK hynix memory solutions inc., San Jose, CA (US)

( * ) Notice: Subject to any disclaimer, the term of this patent is extended or adjusted under 35 U.S.C. 154(b) by 254 days.

(21) Appl. No.: 13/035,770

(22) Filed: Feb. 25, 2011

(65) Prior Publication Data

US 2011/0191653 A1 Aug. 4, 2011

Related U.S. Application Data

(63) Continuation-in-part of application No. 12/970,731, filed on Dec. 16, 2010, now Pat. No. 8,448,041.

(60) Provisional application No. 61/339,564, filed on Mar. 4, 2010, provisional application No. 61/330,627, filed on May 3, 2010, provisional application No. 61/337,287, filed on Feb. 1, 2010.

(51) Int. Cl.
*G11C 29/00* (2006.01)

(52) U.S. Cl.
USPC .......................... 714/763; 714/790; 714/758

(58) Field of Classification Search
USPC ......... 714/763, 790, 753, 752, 776, 780, 758, 714/755, 801
See application file for complete search history.

(56) References Cited

U.S. PATENT DOCUMENTS

| | | | |
|---|---|---|---|
| 5,905,666 A | 5/1999 | Hoffman et al. | |
| 6,757,122 B1 | 6/2004 | Kuznetsov et al. | |
| 7,962,828 B2 | 6/2011 | Kyung et al. | |
| 8,095,859 B1 | 1/2012 | Peterson et al. | |
| 8,196,010 B1 | 6/2012 | Gunnam et al. | |
| 8,255,764 B1 * | 8/2012 | Yeo et al. | 714/758 |
| 8,255,765 B1 * | 8/2012 | Yeo et al. | 714/758 |
| 8,347,190 B2 | 1/2013 | Brauchle et al. | |
| 8,359,515 B2 | 1/2013 | Gunnam | |
| 2002/0188906 A1 | 12/2002 | Kurtas et al. | |
| 2008/0052594 A1 | 2/2008 | Yedidia et al. | |
| 2008/0126908 A1 | 5/2008 | Lin | |
| 2008/0163027 A1 | 7/2008 | Richardson et al. | |
| 2008/0276156 A1 | 11/2008 | Gunnam et al. | |

(Continued)

OTHER PUBLICATIONS

Li et al., "Efficient Encoding of Quasi-Cyclic Low-Density Parity-Check Codes," IEEE Transactions on Communications, vol. 54, No. 1, Jan. 2006.

*Primary Examiner* — Fritz Alphonse
(74) *Attorney, Agent, or Firm* — Van Pelt, Yi and James LLP

(57) ABSTRACT

In processing quasi-cyclic low-density parity-check (QC-LDPC) data, an input signal is received which includes decision and reliability information corresponding to unpadded data. Decision and reliability information corresponding to padded data is introduced into the input signal. Message passing is performed one or more times to obtain decoded data. This includes using (1) the decision and reliability information corresponding to the unpadded data and (2) the decision and reliability information corresponding to the padded data, where a preference is given to the decision and reliability information corresponding to the unpadded data over the decision and reliability information corresponding to the unpadded data during message passing. Zero padding is removed from the decoded data.

20 Claims, 11 Drawing Sheets

(56) References Cited

U.S. PATENT DOCUMENTS

| | | |
|---|---|---|
| 2008/0301521 A1 | 12/2008 | Gunnam et al. |
| 2009/0138785 A1* | 5/2009 | Sakai et al. ............... 714/790 |
| 2009/0150746 A1 | 6/2009 | Chaichanavong et al. |
| 2009/0327847 A1 | 12/2009 | Shen et al. |
| 2010/0023838 A1 | 1/2010 | Shen et al. |
| 2010/0153819 A1 | 6/2010 | Ueng et al. |
| 2010/0162074 A1 | 6/2010 | Oh et al. |
| 2010/0169736 A1 | 7/2010 | Garani |
| 2010/0257425 A1 | 10/2010 | Yue et al. |
| 2012/0221913 A1 | 8/2012 | Anholt et al. |

* cited by examiner

← 400

Single Stage QC-LDPC Encoding

<encoded data (c)> = <user data (u)> * <generator matrix ($G_{QC\text{-}LDPC}$)>

<1xn matrix> = <1×(n-m) matrix > * <(n-m)xn matrix>

<1 x tb matrix> = <1 ×(tb-cb) matrix > * <(tb-cb) x tb matrix>

Dimensions must match in order for
matrix multiplication to work

← 402

First Stage in Multistage QC-LDPC Encoding

<intermediate data (t)> = <user data (u)> * <transpose of first stage matrix ($H_i^T$)>

<1xm matrix)> = <1×(n-m) matrix > * <(n-m)xm matrix>

<1 x cb matrix)> = <1 ×(tb-cb) matrix > * <(tb-cb) x cb matrix>

Dimensions must match in order for
matrix multiplication to work

FIG. 4

QUASI-CYCLIC LDPC ENCODING AND DECODING FOR NON-INTEGER MULTIPLES OF CIRCULANT SIZE

CROSS REFERENCE TO OTHER APPLICATIONS

This application is a continuation in part of U.S. patent application Ser. No. 12/970,731 entitled MULTISTAGE LDPC ENCODING filed Dec. 16, 2010, which is incorporated herein by reference for all purposes, which claims priority to U.S. Provisional Patent Application No. 61/337,287 entitled EFFICIENT ENCODING OF A GENERAL LDPC CODE filed Feb. 1, 2010 which is incorporated herein by reference for all purposes; this application also claims priority to U.S. Provisional Patent Application No. 61/339,564 entitled QUASI-CYCLIC LOW-DENSITY-PARTY-CHECK CODES ENCODING filed Mar. 4, 2010 which is incorporated herein by reference for all purposes and to U.S. Provisional Patent Application No. 61/330,627 entitled LDPC ENCODER AND DECODER filed May 3, 2010 which is incorporated herein by reference for all purposes.

BACKGROUND OF THE INVENTION

Quasi-cyclic low-density parity-check (QC-LDPC) codes are a special type of LDPC codes. QC-LDPC codes (as opposed to non-QC-LDPC codes) have parity check matrices that can be broken down into a building block called a circulant. Encoders that use QC-LDPC codes expect input data to have a length that is an integer multiple of the circulant size. It would be desirable if new techniques could be developed that permit other data lengths. In some embodiments, an encoder includes a multistage encoder where a parity check matrix or a generator matrix is broken down into sub-matrices and the various stages of the multistage encoder use respective sub-matrices. It would be further desirable if the new techniques which permit data lengths which are not integer multiples of the circulant size also work with multistage coding techniques.

BRIEF DESCRIPTION OF THE DRAWINGS

Various embodiments of the invention are disclosed in the following detailed description and the accompanying drawings.

FIG. 4 is a diagram showing some embodiments of matrix multiplications performed during encoding using a QC-LDPC code.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
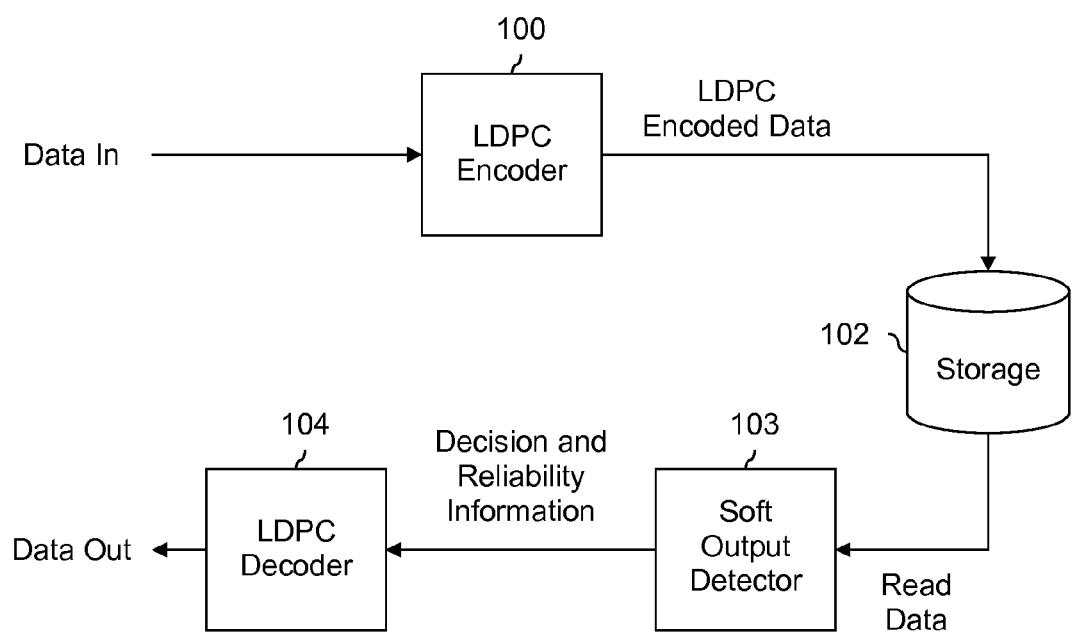
FIG. 1 is a diagram showing an embodiment of a system configured to encode and store data using a low-density parity-check (LDPC) code.

FIG. 1 is a diagram showing an embodiment of a system configured to encode and store data using a low-density parity-check (LDPC) code. In the example shown, LDPC encoder 100 receives data in and includes data which is desired to be stored. LDPC encoded data is output by LDPC encoder 100 and is written to storage 102.

In various embodiments, storage 102 includes a variety of storage types or media such as (e.g., magnetic) disk drive storage, Flash storage, etc. In some embodiments, the techniques are employed in a transceiver and instead of being written to or read from storage, the data is transmitted and received over a channel (e.g., wire-line or wireless).

When the stored data is requested or otherwise desired (e.g., by an application or user which stored the data), soft output detector 103 accesses storage 102 and retrieves read data which includes some noise or errors. Soft output detector 103 performs decoding on the read data and outputs decision and reliability information. For example, soft output detector 103 may be a soft output Viterbi decoder. A hard decoder (which decoder 103 is not) is one that outputs a decision without providing corresponding reliability information. For example, a hard decoder may output a decision that a particular bit is a "1" or a "0" without indicating how certain or sure the decoder is in that decision. In contrast, a soft output detector outputs a decision and reliability information associated with the decision. A reliability value (in general) indicates how certain the decoder is in a given decision. In one example, a soft output decoder outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and reliability information is passed to LDPC decoder 104 which performs LDPC decoding using the decision and reliability information. The data generated by LDPC decoder 104 is passed to the appropriate entity (e.g., the user or application which requested it). With proper encoding and decoding, the data in matches the data out.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

In LDPC codes (both quasi-cyclic (QC) and non-QC), the code is defined by or otherwise characterized by a parity check matrix (H); for all LDPC codes, H is a matrix of size m×n (i.e., m rows and n columns). One property of QC-LPDC codes is that they have a structure which is relatively repeatable or repetitive, which makes them attractive because a smaller amount of storage can be used to store the matrix. In particular, a QC-LDPC parity check matrix ($H_{QC\text{-}LDPC}$) has a building block called a circulant from which a QC-LDPC parity check matrix can be (re)generated. An example of a QC-LDPC parity check matrix and circulant are described in further detail below.

From a QC-LDPC parity check matrix, a QC-LDPC generator matrix ($G_{QC\text{-}LDPC}$) can be generated. A generator matrix (for both QC and non-QC codes) is used to generate LDPC encoded data from the input data. For example, if the input data is represented as u, a 1×(n−m) matrix, and the encoded write data is represented as c (a 1×n matrix) then c=u*G, where "*" is a matrix multiplication. In some cases, a generator matrix (G) is manipulated to be in a special form (i.e., a systematic matrix) where G=[I P] and I is the identity matrix and P is a parity generator matrix. In systematic form, the encoded data (c) includes the input data (u) in its original form. In one example, the encoded data may be the input data (u) followed by the parity bits. Parity data (p) may be obtained from u*P and when combined (e.g., by appending or concatenating) with the input data generates the codeword (i.e., the encoded data).

Figure 2:
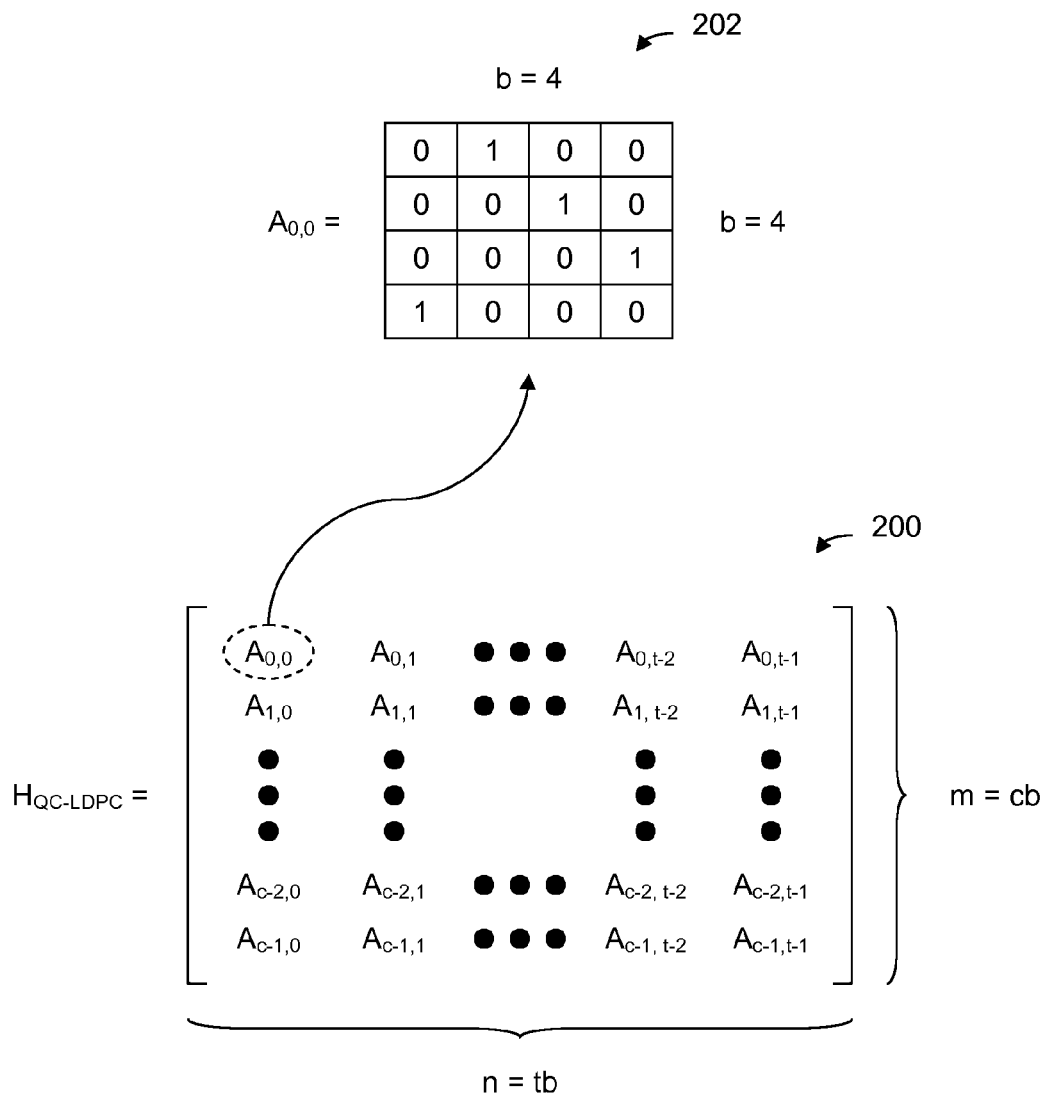
FIG. 2 is a diagram illustrating an embodiment of a QC-LDPC parity check matrix and a circulant from which the associated QC-LDPC parity check can be (re)generated.

FIG. 2 is a diagram illustrating an embodiment of a QC-LDPC parity check matrix and a circulant from which the associated QC-LDPC parity check can be (re)generated. In the example shown, QC-LDPC parity check matrix ($H_{QC\text{-}LDPC}$) is an m×n matrix where both m and n are the product of two integers (i.e., c and b in the case of m and t and b in t). QC-LDPC parity check matrix 200 includes a plurality of circulants, $A_{i,j}$. A circulant is a square matrix having dimensions b×b where each row vector or column vector is a cyclic shift (e.g., up or to the left) of the row vector or column vector before it. The dimension b is the circulant size. Circulant 202 shows an example circulant for $A_{0,0}$. In this example, b=4 and each row vector in circulant 202 is a copy of the previous row vector which is cyclically shifted one place to the right where values at the end wrap around to the beginning Information associated with one or more circulants is stored and using the stored information the QC-LPDC parity check matrix 200 can be completely regenerated. Some examples of what circulant-related information is stored is described in further detail below.

In some embodiments, QC-LDPC encoding is performed in multiple stages (e.g., as opposed to a single pass or a single stage). The following figure describes one such embodiment.

Figure 3:
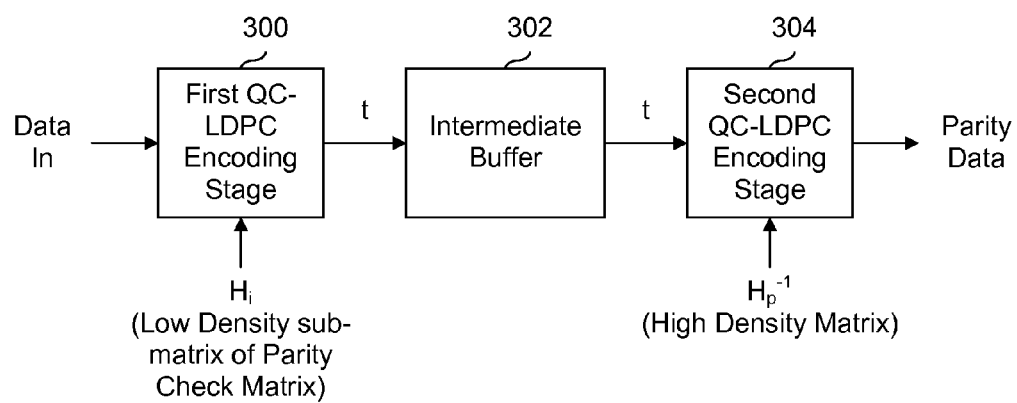
FIG. 3 is a diagram showing an embodiment of a two stage QC-LDPC encoder.

FIG. 3 is a diagram showing an embodiment of a two stage QC-LDPC encoder. In the example shown, a QC-LDPC parity check matrix $H_{QC\text{-}LDPC}$ (not shown) is broken down into two sub-matrices: a m×(n−m) sub-matrix and a m×m sub-matrix $H_p$. The inversion of the sub-matrix $H_p$ has the same size of m×m and is a relatively high density matrix (e.g., in one example the ratio of 1's to 0's is roughly 1 to 1), denoted by $H_p^{-1}$; the sub-matrix $H_i$ has a relatively low density (e.g., mostly 0's with relatively few 1's). $H_p$ is a low density matrix whereas the inversion of $H_p$ (i.e., $H_p^{-1}$) is high density. The size of the two sub-matrices varies depending upon the values of m and n; in some cases with exemplary and/or typical values for m and n (i.e., m<<n), the size of the sub-matrix $H_p$ and its inversion $H_p^{-1}$ is much smaller compared to the size of the sub-matrix $H_i$. In some embodiments, QC-LDPC encoder 100 shown in FIG. 1 is implemented as shown in this figure.

The low density sub-matrix and a high density matrix $H_p^{-1}$ are passed to and used respectively by the first QC-LDPC encoding stage (300) and the second QC-LDPC encoding stage (304). The first encoding stage (300) performs the operation $u*H_i^T$ where u is the 1×(n−m) matrix of input data. $H_i^T$ is an (n−m)×m matrix so the matrix multiplication results in intermediate data (t) in the form of a 1×m matrix.

The intermediate data is passed to intermediate buffer 302 where it is stored. For example, second encoding stage 304 may be busy with other intermediate data (e.g., associated with earlier input data) and when second encoding stage 304 is free the stored intermediate data is retrieved from intermediate buffer 302. In some embodiments, intermediate buffer 302 includes 2 "ping pong" buffers or memories which switch off. For example, while intermediate data for a first (e.g., later arriving) set of input data is being generated by first encoding stage 300 and is being written to the first buffer, intermediate data associated with a second (e.g., earlier arriving) set of input data is being passed from the second buffer to the second encoding stage (304). Once the first buffer is full and the second buffer has been emptied, the two buffers switch off (i.e., the first buffer offloads its intermediate data to the second encoding stage while the second buffer receives intermediate data associated with a third (e.g., even later arriving) set of input data from the first encoding stage). In some embodiments, buffer 302 includes one or more FIFOs so that first encoding stage 300 and second encoding stage 304 do not need to deal with memory addresses when loading or unloading intermediate data (t).

Second encoding stage 304 performs the operation $t*(H_p^{-1})^T$ which produces parity data in the form of a 1×m matrix. By combining the parity data with the input data (e.g., by concatenation so the encoded data comprises the input data with the parity data attached after it), QC-LDPC encoded data in systematic form may be produced.

FIG. 4 is a diagram showing some embodiments of matrix multiplications performed during encoding using a QC-LDPC code. In the example shown, diagram 400 shows how encoded data (c) is generated using a single stage QC-LDPC encoder. In that example, encoded data is generated by performing a matrix multiplication of the user data (u) and the generator matrix ($G_{QC-LDPC}$). In terms of matrix dimension, this corresponds to a 1×n matrix produced by multiplying 1×(n−m) matrix with a (n−m)×n matrix. In terms of the circulant size (that is, b), a 1×tb matrix is generated by multiplying a 1×(tb−cb) matrix with a (tb−cb)×tb matrix.

Diagram 402 shows a matrix multiplication associated with a first stage of a multistage QC-LDPC encoder (e.g., the matrix multiplication performed by first encoding stage 300 in FIG. 3). In this example, intermediate data (t) is produced by multiplying user data (u) with the transpose of a first stage matrix ($H_t^T$). This corresponds to a 1×m matrix which is generated by multiplying a 1×(n−m) matrix with a (n−m)×m matrix; when expressed in units of b, c and t this corresponds to a 1×cb matrix generated by multiplying a 1×(tb−cb) matrix with a (tb−cb)×cb matrix.

According to matrix multiplication rules, the second dimension of the multiplier (i.e., the user data) must match the first dimension of the multiplicand in both 400 and 402. As a result, the user data for both single stage QC-LDPC encoding and multistage QC-LDPC encoding must have a length which is an integer multiple of b (e.g., since t and b are both integers, t−b is also an integer and therefore tb−cb is an integer multiple of b). It would be desirable to be able to process data that does not necessarily satisfy this constraint. For example, some systems may be "hardcoded" with a single code and it would be desirable to support user data lengths which are not integer multiples of the circulant size. In another example, a system stores multiple sets of parity check matrix and generator matrix pairs (or circulant-related information from which the matrix pair can be regenerated) and loads a selected matrix pair into memory to be used by an encoder and decoder capable of supporting multiple codes. In such embodiments, it may be desirable to process user data having a length that is not an integer multiple of the circulant size without having to unload a matrix pair and reload a matrix pair (e.g., loading and unloading may be time consuming). What is described herein is a technique that enables data not having a length which is an integer multiples of the circulant size to be encoded. In some embodiments, the technique is used in a single stage QC-LDPC encoder; in other embodiments the technique is used in a multistage QC-LDPC encoder.

Figure 5:
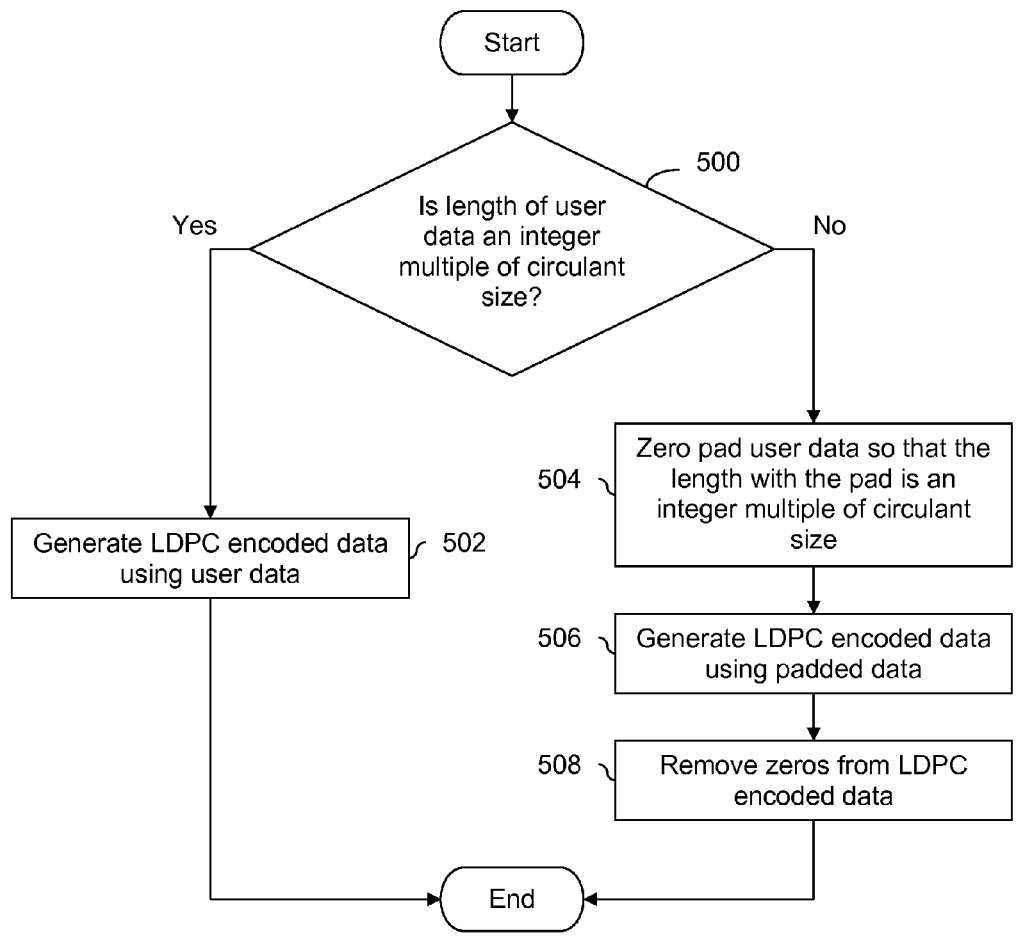
FIG. 5 is a flowchart illustrating an embodiment of a QC-LDPC encoding process able to process data having a length which is not an integer multiple of the circulant size.

FIG. 5 is a flowchart illustrating an embodiment of a QC-LDPC encoding process able to process data having a length which is not an integer multiple of the circulant size. In various embodiments, QC-LDPC encoder 100 in FIG. 1 and/or first QC-LDPC encoding stage 300 in FIG. 3 perform the process shown. In some embodiments, some higher level entity (e.g., a driver or application) passes user data to write controller 600 having variable lengths. That is, one piece of user data may have one length but the length of the next piece of user data may not necessarily have the same length. In some embodiments, the higher level entity passes user data which is consistent in length from one piece of user data to another (e.g., at least for some period of time until a configuration or setting is changed).

At 500, it is determined if the length of the user data is an integer multiple of circulant size. If so, LDPC encoded data is generated using the user data at 502. See, e.g., the matrix multiplications shown in FIG. 4. Since the length is already an integer multiple of the circulant size, no padding is performed.

Otherwise, at 504, user data is zero padded so that the length with the pad is an integer multiple of circulant size. In some embodiments, a QC-LDPC parity check matrix ($H_{QC-LDPC}$) and/or a QC-LDPC generator matrix ($H_{QC-LDPC}$) is already loaded and padding is at 504 is performed so that the padded length matches the dimensions of the loaded matrix (e.g., so that the padded data has a length of tb−cb). In some embodiments, the zero pad is added to the beginning of the user data (e.g., if the circulant size is 4 bits and the length of the unpadded data is 9 bits then the data is padded with 3 additional bits of known value to produce [0 0 0 u]). In various other embodiments, the zero pad is interspersed with the user data, is appended after the user data, etc. For example, in the previous example, 3 user bits may be followed by 1 pad bit, then another 3 user bits and another pad bit and so on.

At 506, LDPC encoded data is generated using the padded data. In various embodiments, step 506 includes a single stage QC-LDPC encoding or a multistage QC-LDPC encoding. Regardless of which technique is used, encoded data is produced which contains zeros resulting from the zero pads. To use the above example where 3 zero pads were added at the beginning of the user data, the result of step 506 is [0 0 0 c] or alternatively in systematic form where the user data is included in the encoded data [0 0 0 u p] where p is the parity data.

At 508, the zeros are removed from the LDPC encoded data. For example, [0 0 0 c] becomes [c] or [0 0 0 u p] becomes [u p]. In some applications it is desirable to insert the zero pad at the beginning or end of the user data so that removing the zeros at 508 is more easily accomplished and/or the encoder design is simplified.

Removing zeros at 508 is acceptable and even desirable in some applications. For example, in storage applications the storage capacity is of significant interest and removing the zero pads before writing to storage is desirable since storage capacity is improved. Similarly, in some wireless applications it is expensive (e.g., in terms of power consumption or because only one packet can occupy the channel at any given time) to transmit data over the air and removing the zero pad may reduce the length of the packet sent over the air.

Figure 6:
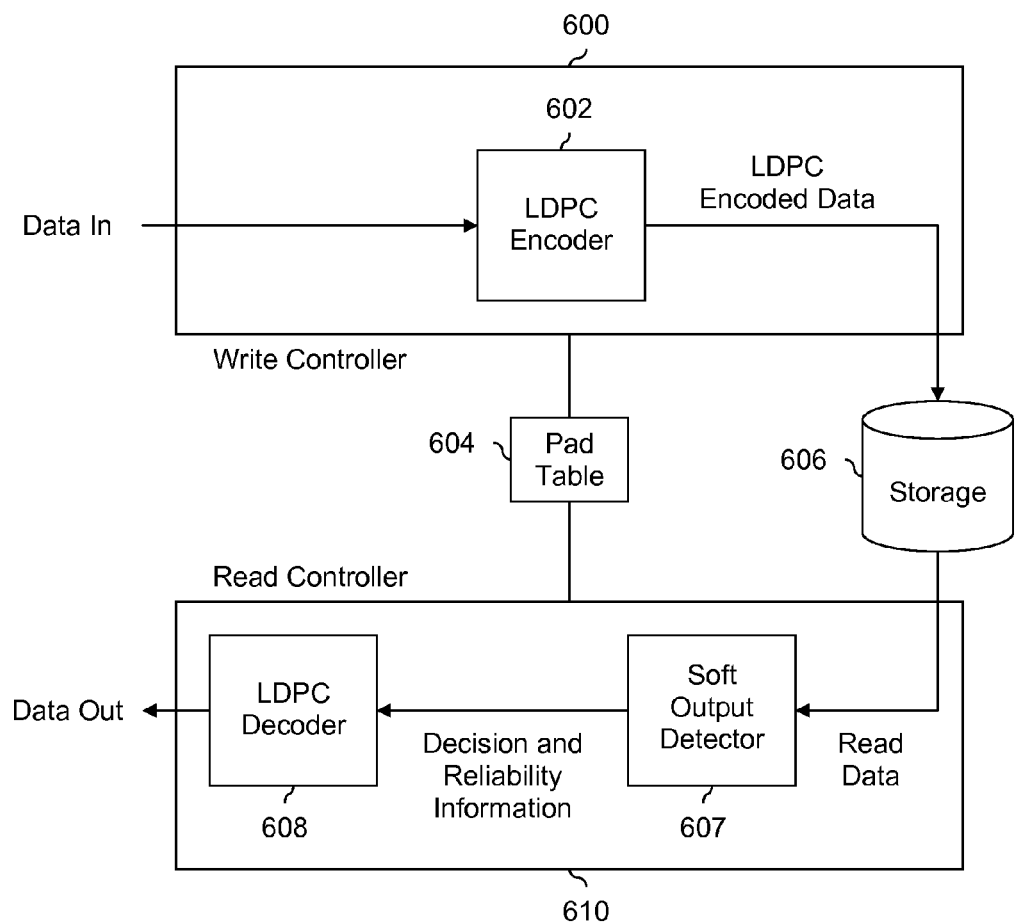
FIG. 6 is a diagram showing an embodiment of a read controller and a write controller which use a pad table to exchange pad related information.

FIG. 6 is a diagram showing an embodiment of a read controller and a write controller which use a pad table to exchange pad related information. In the example shown, write controller 600 receives data in, some or all of which have lengths which are not integer multiples of the circulant size, b. LDPC encoder 602 is configured to pad as/if needed the data in so that the length of the padded data is an integer multiple of the circulant size and then perform LDPC encoding on the padded data.

Write controller 600 writes pad information to pad table 604 which is used by read controller 610 during processing. In some embodiments, processing performed by read controller 610 varies depending upon whether a particular sector was padded by write controller or not; read controller 610 may use the pad information to determine what processing is appropriate for a given sector. Some examples of the information exchanged between controllers 600 and 610 using pad table 604 include: the locations on storage 606 of those sectors which include padded data (e.g., physical addresses or an offset with respect to some reference), where the pad information is located (e.g., if the pad information is mixed in together with the data in, if the zero pad is at the clustered together at the beginning/end), etc.

LDPC decoder 608 uses the information stored in 604 to determine appropriate processing and performs that processing on the decision and reliability information passed to it. The following figure describes an embodiment of how LDPC decoder 608 uses padding information stored in pad table 604 during decoding processing.

Figure 7:
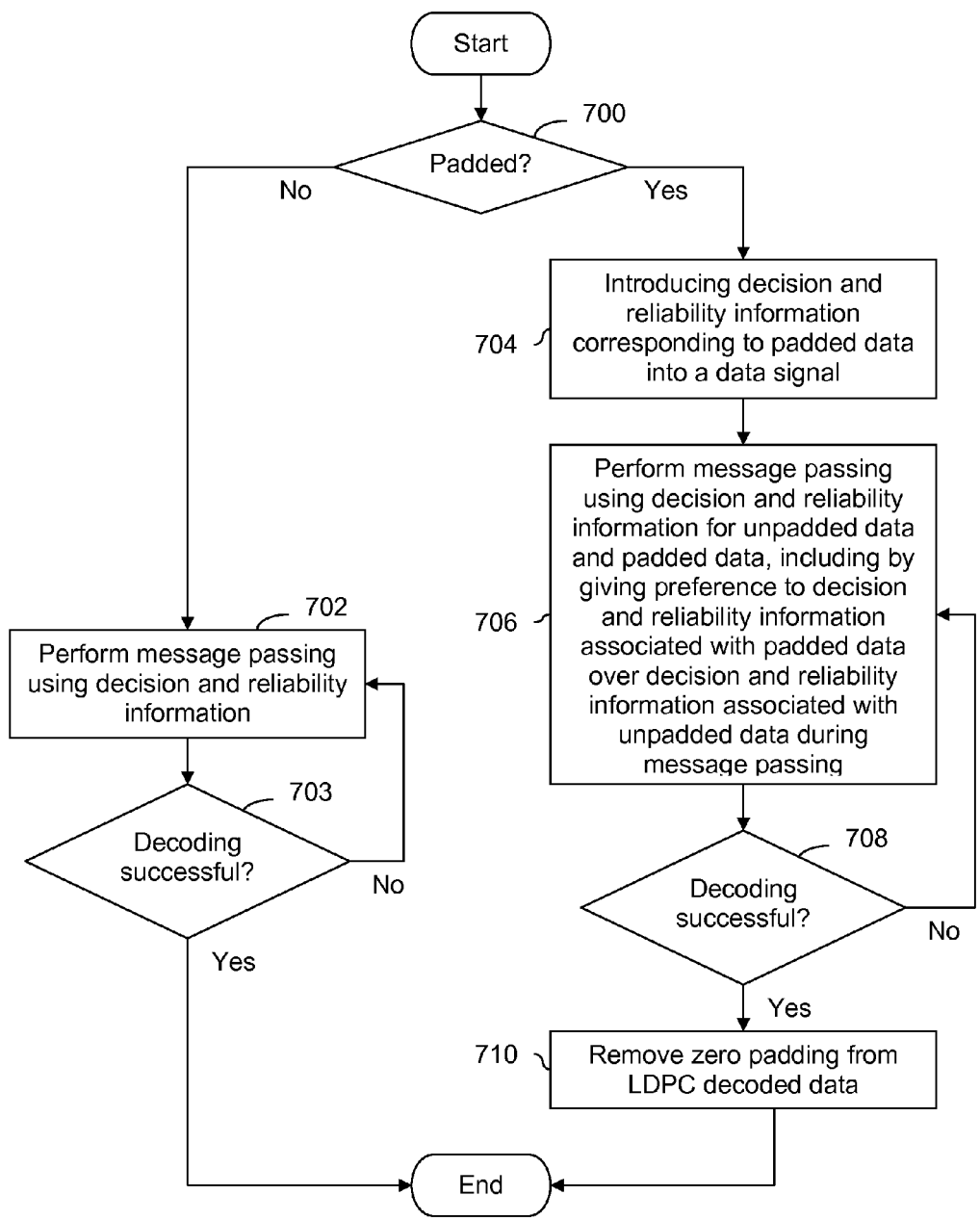
FIG. 7 is a flowchart illustrating an embodiment of a LDPC decoding process in which preference is given to decision and reliability information associated with the padded data over that associated with unpadded data.

FIG. 7 is a flowchart illustrating an embodiment of a LDPC decoding process in which preference is given to decision and reliability information associated with the padded data over that associated with unpadded data. In some embodiments, LDPC decoder 608 in FIG. 6 performs some or all of the steps described below.

At 700 it is determined if data being processed has been padded. For example, the data may have been stored at a particular sector or location on disk and information stored in pad table 604 in FIG. 6 indicates to LDPC decoder 608 whether that piece of data is associated with padded data. Note that the padded data is not stored in storage for those sectors or locations, but in order to properly decode those sectors or locations a decoder needs to know padding was performed by the write controller. If it is determined at 700 there is no padding (e.g., based on stored information in a pad table), message passing is performed using decision and reliability information at 702. For example, the decision and reliability information generated by soft output detector 607 in FIG. 6 (and only that information) is used. Some examples of message passing processes include sum product algorithm (SPA), minimum sum, scaled minimum sum, and offset minimum sum. After an iteration of message passing, it is determined at 703 if decoding was successful. For example, syndromes may be checked and if all the syndromes are zero then decoding is declared to be successful. If decoding is not successful, another iteration of message passing is performed at 702 (e.g., with updated values from the previous iteration of message passing). In some embodiments if a maximum number of iterations is reached a decoding failure is declared.

Otherwise, if it is determined at 700 that the data being process has been padded, decision and reliability information corresponding to padded data is introduced into a data signal at 704. For example, if step 508 in FIG. 5 is [0 0 0 c]–>[c] or [0 0 0 u p]–>[u p] then step 704 for the corresponding sector or storage location is [r]–>[0 0 0 r] where r is the decision and reliability information received from a soft output detector. Referring back to the embodiment shown in FIG. 6, the padded data is not actually stored in storage 606 and so there will be no decision or reliability information received for the padded data by LDPC decoder 608 from soft output detector 607. A variety of hardware components may be used to introduce decision and reliability information at 704 such as some sort of signal injector (e.g., a multiplexer) which inputs decision and reliability information from a soft output detector (e.g., corresponding to unpadded data which is stored in storage or transmitted over a transmission channel) and introduces, into that signal, decision and reliability information for padded data (e.g., which was not stored or transmitted). In some embodiments, step 704 a decision corresponding to the padded data is set to 0 (e.g., because in a corresponding encoder embodiment, a zero pad is used). In some embodiments, the reliability is set to the highest value (e.g., in the case of LLRs, to the largest magnitude).

At 706, message passing is performed using decision and reliability information for unpadded data and padded data, including by giving preference to decision and reliability information associated with padded data over decision and reliability information associated with unpadded data during message passing. In various embodiments this is performed in a variety of ways. In general, the idea is that the padded data is known so that decision and/or reliability information should be favored, preferred over or otherwise dominate that information associated with unpadded data. For example, in a communications application the transmission channel may be lossy or noisy or in a storage application the read head may receive signal information from an adjacent track. This can cause a soft output detector (e.g., 607 in FIG. 6) to output an incorrect decision and/or an inaccurate measure of reliability for the unpadded data which was stored or transmitted. The incorrect decision and the inaccurate reliability may in turn affect the decision and the reliability of the padded bits during the message passing in a negative way. By giving or otherwise forcing preference based on the known information, the negative effect on the padded bit can be removed and the quality of the messages associated to the unpadded bits can be improved. The particular implementation of how preference is given at 706 may depend upon the specific message passing process used (e.g., because different message passing processes have different rules for how information is exchanged, combined, selected, and such). Some techniques for implementing how the decision and/or reliability information associated with the padded data is given preference over that for unpadded data can be implemented by 1) setting a value which is input to the message passing process to one that forces the preference (e.g., setting a reliability value at step 704 to a maximum reliability or certainty) and/or 2) modifying the rules for a message passing process to favor the decision and reliability information associated with the padded bits (e.g., by fixing the message transmitted on a connection to certain value and/or changing (at least temporarily) a network of connections between a plurality of check nodes (C-Node) and a plurality of variable nodes (V-Nodes) for example by erasing or ignoring at least temporarily one or more connections between a variable node and a check node).

After the message passing with a preference for decision and reliability information associated with padded data is performed at 706, it is determined whether decoding was successful at 708. For example, a plurality of syndromes may be checked and if they are all zero then decoding is declared to be successful. If decoding is not determined to be successful at 708 then another iteration of message passing with a preference for decision and reliability information associated with padded data is performed at 706. Otherwise, zero padding is removed from the LDPC decoded data at 710. For example, [0 0 0 c] (or alternatively [0 0 0 u p]) after step 710 the data would be [c] (or alternatively [u p]). In some embodiments, where the decoded data is in systematic form (i.e., [u p]) the parity, p, is also removed so that the original user data, u, is obtained (e.g., [u p]–>[u]). In hardware, a filter (e.g., which removes certain bits or data from a signal, stream or sequence) may be used in step 710.

The following illustrates a message passing algorithm where there is no preference given to decision and reliability information of one type of bits over another type of bits (e.g., preference for padded bits over unpadded bits). In some embodiments the following messaging passing is used for unpadded bits (but not necessarily padded bits):

1) C-Node update: $m(c_i \text{ to } v_j) = \text{functionC}(\{m(v_k \text{ to } c_i), \text{ all } k \text{ such that } v_k \text{ is connected to } c_i \text{ and } k \mathrel{!}= j\})$.

Here, the functionC (shortened as fc hereafter) is determined by the particular message passing algorithm employed; a variety of message passing algorithms may be used. For example, if the message passing algorithm (fc) is a minimum function then fc(A) will choose the minimum value of the set A.

2) V-Node update: $m(v_j \text{ to } c_i) = \text{fv}(\{L_j \text{ and } m(c_k \text{ to } v_j), \text{ all } k \text{ such that } c_k \text{ is connected to } v_j \text{ and } k \mathrel{!}= i\})$.

In most message algorithms, fv is a summation function so that $\text{fv}(\{A\})$ is the summation of all elements in the set A.

3) Syndrome check: compute $LO_j = \text{fv}(\{L_j \text{ and } m(c_k \text{ to } v_j), \text{ all } k \text{ such that } c_k \text{ is connected to } v_j\})$.

In this example, a hard decision is made by slicing $LO_j$ and computing the syndromes. If not all syndromes are zero, go back to C-Node update.

As described above, no modification to the above process (e.g., to give a preference to decision and reliability information associated with padded bits) is performed, other than setting $L_i$ for padded bits is to be the known decision and some (e.g., highest) reliability. For example, if the padded bit i is 0, then $L_i = L_{max}$, where $L_{max}$ is the largest positive LLR.

For those situations in which a modification is performed (e.g., to the above exemplary unmodified message passing algorithm), one such embodiment is to keep the C-Node update unchanged and modify the V-Node update and Syndrome check. For example:

2A) V-Node update: $m(v_j \text{ to } c_i) = L_{max}$ for all i such that $c_i$ connected to $v_j$.

3A) Syndrome check: $LO_j = L_{max}$. Make hard decisions by slicing $LO_j$ and computing the syndromes. If they are not all zero, go back to C-Node update.

Another embodiment is to keep the V-Node update unchanged and modify the C-Node update and Syndrome check. For example:

1B) C-Node update: $m(c_i \text{ to } v_j) = fc(\{m(v_k \text{ to } c_i), \text{ all k such that } v_k \text{ is connected to } c_i \text{ and } k != j \text{ and } v_k \text{ is not a padded bit}\})$.

3B) Syndrome check: $LO_j = L_{max}$. Make hard decisions by slicing $LO_j$ and computing the syndromes. If they are not all zero, go back to C-Node update.

Figure 8A:
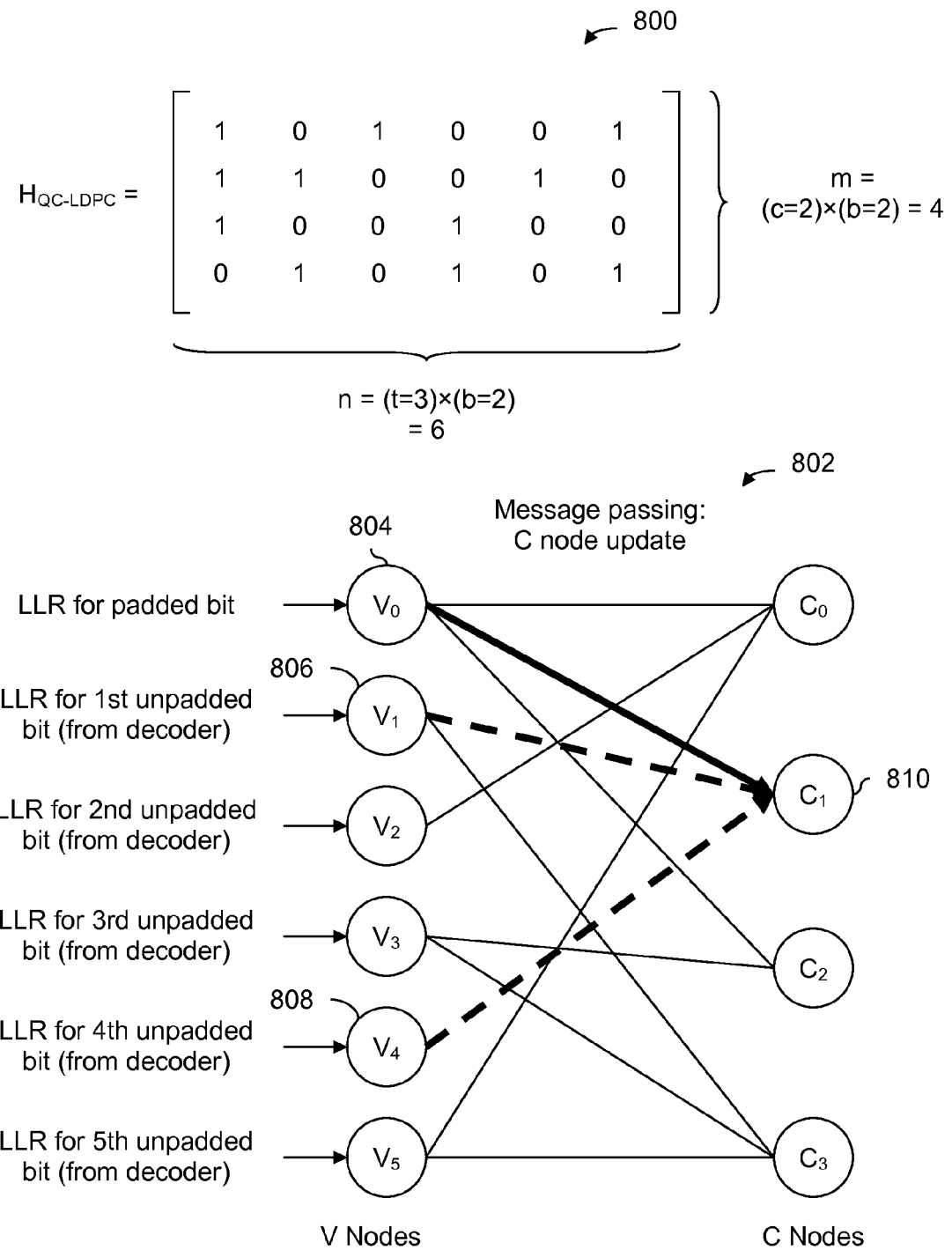
FIG. 8A is a diagram showing an embodiment of a QC-LDPC parity check matrix and a check node update where decision and reliability information associated with padded data is given preference over that for unpadded data.

FIG. 8A is a diagram showing an embodiment of a QC-LDPC parity check matrix and a check node update where decision and reliability information associated with padded data is given preference over that for unpadded data. In the example shown, t=3, b=2 and c=2 so that QC-LDPC parity check matrix 800 has 6 column vectors (n=(t=3)×(b=2)=6) and 4 row vectors (m=(c=2)×(b=2)=4).

Message passing uses a network of variable nodes and check nodes which are connected. The connections between variable nodes and check nodes are described by and correspond to the values of the corresponding parity check matrix. Network 802 shows the network corresponding to QC-LDPC parity check matrix 800. The variable nodes in network 802 correspond to the column vectors in matrix 800 and the check nodes in network 802 correspond to the row vectors of matrix 800. The interconnections between the nodes are determined by the values of matrix 800, where a 1 indicates the corresponding check node and variable nodes have a connection and a 0 indicates there is no connection. For example, the 1 in the leftmost column vector and the second row vector from the top in matrix 800 corresponds to the connection between variable node 804 and check node 810.

In this example, the original user data contained 5 bits, and since 5 is a non-integer multiple of the circulant size (b=2 in this example) a single zero pad bit was added. Network 802 shows an initial iteration where for those variable nodes corresponding to unpadded data (in this example, variable nodes $V_1$ through $V_5$), the LLR values (or, more generally, decision and reliability information) received from a soft output detector are passed to or associated with the corresponding variable nodes. For those variable nodes corresponding to padded bits (in this example, variable node $V_0$) the LLR values (e.g., introduced by a signal injector), which is the known decisions and the largest reliability, is passed to or assigned to the corresponding variable nodes.

During check node updating, the values of the check nodes are updated. In this example, preference for decision and reliability information associated with padded bit is implemented or enforced 1) by ignoring connections from padded bit at least temporarily if min-sum decoding algorithm or its variations are employed or 2) by setting them to the known decisions and the largest reliability for the messages over the connections from padded bits. To update the value of check node $C_1$ (810), the connections between variable node 804 and check node 810 is ignored at least temporarily. This is indicated in network 802 by dashed lines between those nodes. As a result of ignoring (at least temporarily) those connections, the value of check node 810 is updated using only the LLR for the padded bit for case 1) mentioned above. In some cases there is no connection to a variable nodes associated with a padded bit and no preference is given to one connection or data value over another (i.e., since the decision and reliability information in that set or group are all associated with unpadded data they are all treated equally without any preference for one over the other). For example, check node $C_3$ is not connected to a variable node associated with a padded bit and the connections to and data from variable nodes $V_1$, $V_3$ and $V_5$ are treated as prescribed by the particular message passing technique (e.g., they are weighted or treated equally).

Figure 8B:
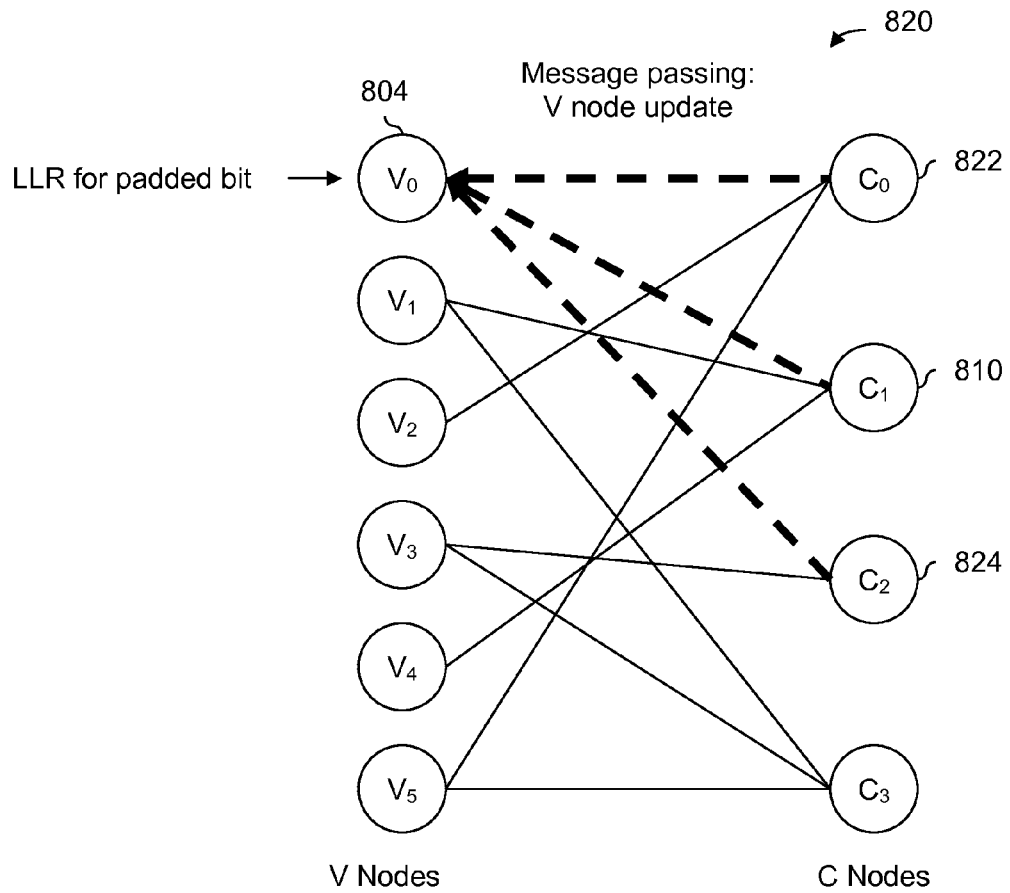
FIG. 8B is a diagram showing an embodiment of a variable node update where decision and reliability information associated with padded data is given preference over that for unpadded data.

FIG. 8B is a diagram showing an embodiment of a variable node update where decision and reliability information associated with padded data is given preference over that for unpadded data. In the example shown, variable node 804 is associated with a padded bit. To give preference to the decision and reliability information associated with the padded data, the value of variable node 804 in this example is held constant (e.g., to be the LLR for the padded bit inserted by a signal injector as opposed to being updated using the values associated with check nodes 822, 810 or 824. In contrast, variable nodes associated with unpadded bits (in this example, variable nodes $V_1$ through $V_5$) are updated using the network connections which correspond to the values of the parity check matrix (e.g., 800 in FIG. 8A).

Storing the Generator Matrix and/or the Parity Check Matrix

Some systems are configured to store the generator matrix and/or the parity check matrix. For example, a system may store a plurality of matrix pairs, each of which is associated with a different data rate, different error correction capabilities, etc. A user or driver may configure the system to load a specified matrix pair and encode/decode information using the loaded matrix pair. Such a system may be more attractive than a system with a single, hardcoded matrix pair since it offers flexibility and/or multiple modes of operation. In another example, a system is initially "blank" and a user or driver loads a matrix pair into the system where it is stored. For example, some end users may prefer to use a specific LDPC code and/or not have other people (including a storage or communication systems manufacture) know what code is being used. The following figures are used to describe some techniques for storing a generator matrix and/or a parity check matrix in an efficient manner.

Figure 9:
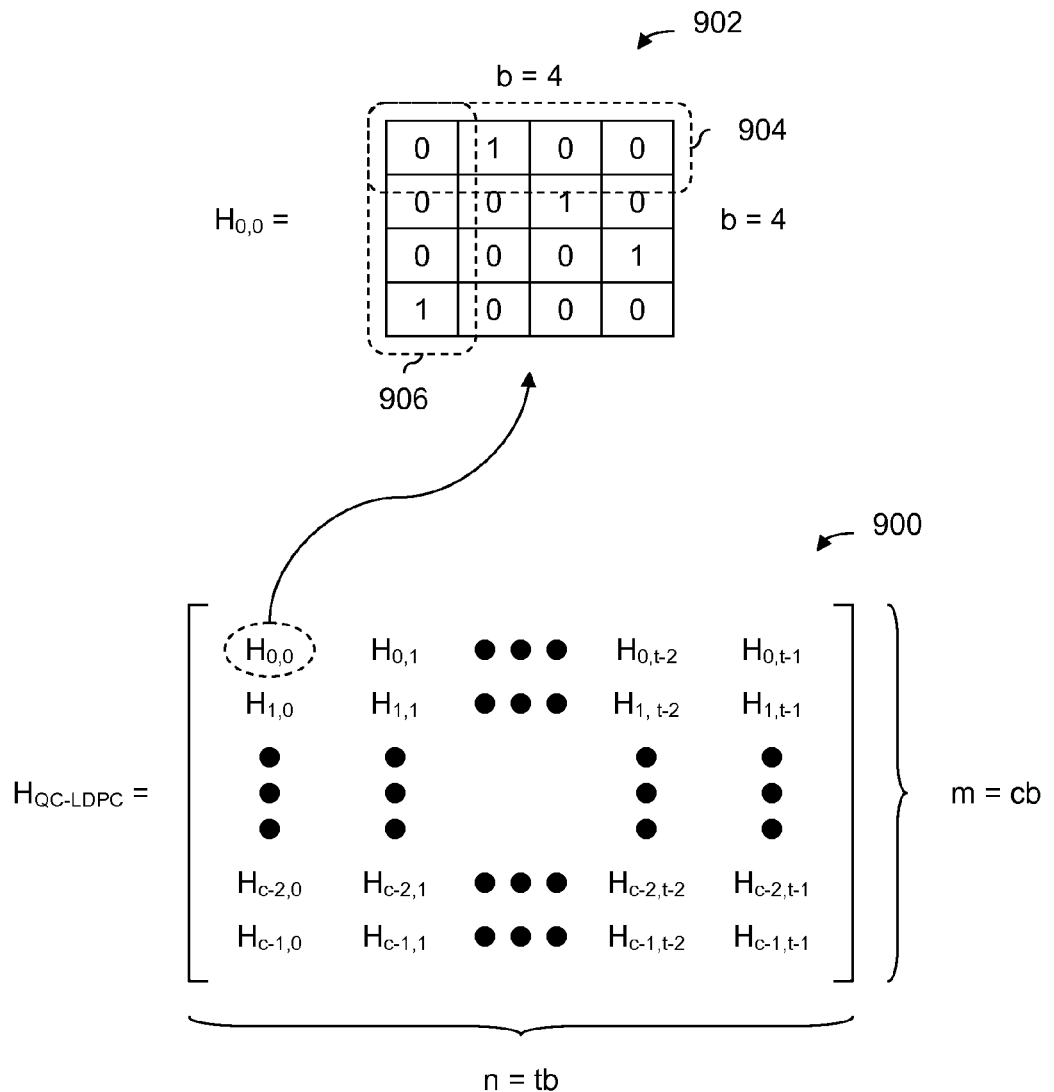
FIG. 9 is a diagram showing an embodiment of a QC-LDPC parity check matrix.

FIG. 9 is a diagram showing an embodiment of a QC-LDPC parity check matrix. In the example shown, QC-LDPC parity check matrix 900 includes a plurality of circulants. One of the circulants, $H_{0,0}$ (902), is shown and has a circulant size of b=4 in this example. Circulant 902 includes a plurality of vectors, including row vector 904 and column vector 906.

Figure 10:
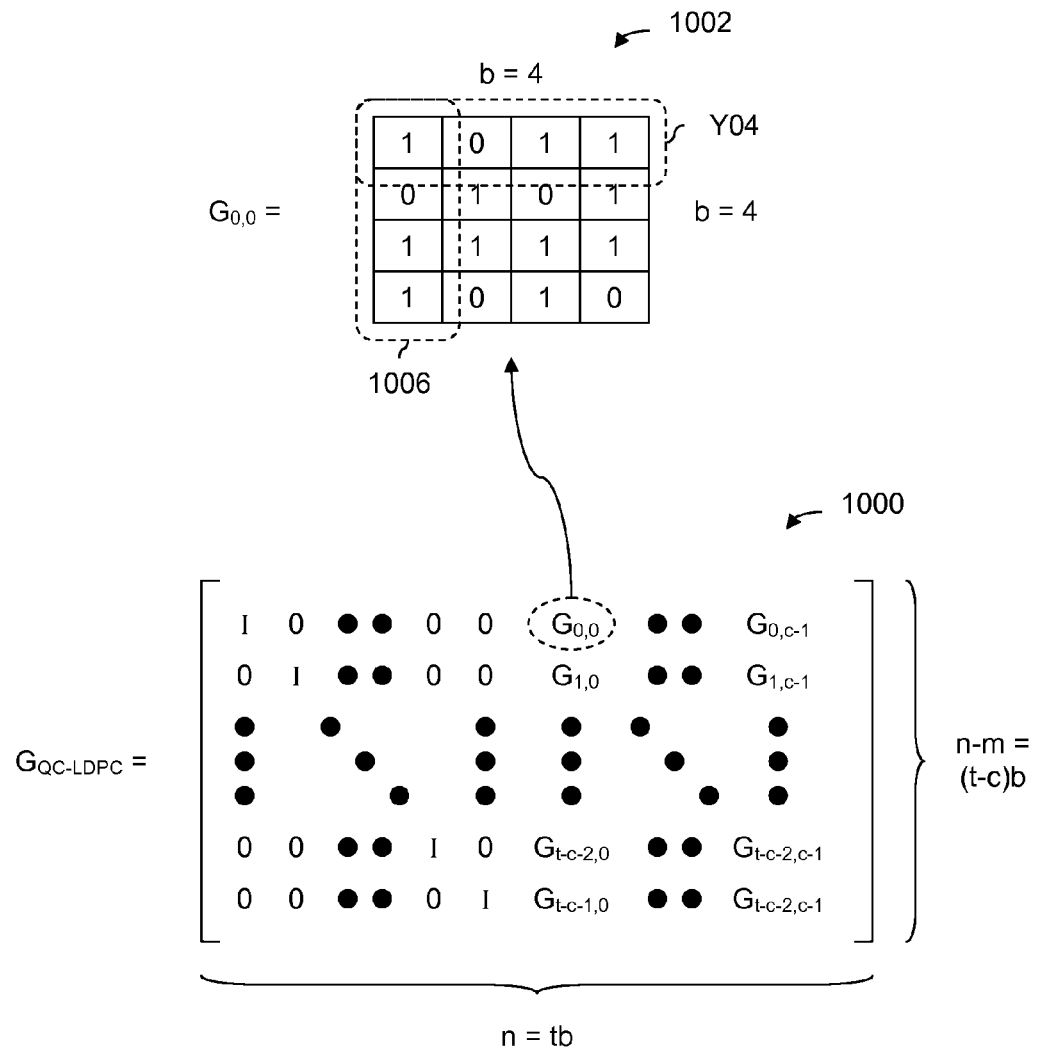
FIG. 10 is a diagram showing an embodiment of a QC-LDPC generator matrix.

FIG. 10 is a diagram showing an embodiment of a QC-LDPC generator matrix. In the example shown, QC-LDPC generator matrix 1000 includes a plurality of circulants; circulant $G_{0,0}$ (1002) is shown with an example circulant size of b=4. A plurality of vectors make up circulant 1002, including row vector 1004 and column vector 1006.

Oftentimes LDPC parity check matrices (which include QC-LDPC parity check matrices) are low density matrices. Put another way, the number of 1's in a LPDC parity check matrix tends to be low. In contrast, an LDPC generator matrix typically is not low density and has a more 1's compared to the parity check matrix.

In some embodiments, for a given one of the circulants (e.g., associated with a parity check matrix or a generator matrix), one and only one vector from that circulant is stored. For example, for parity check matrix 902, the only information stored for that circulant is row vector 904. Or, for generator matrix 1002, the only information stored for that circulant is column vector 1006. In some embodiments, a single vector is stored for each circulant (e.g., a first vector from circulant $G_{0,0}$ is stored, a second vector from $G_{0,1}$ is stored, etc.).

In some embodiments, storing the parity check matrix includes storing, for at least one of the plurality of circulants, the location(s) of the 1's in one vector. For example, for circulant 904 associated with QC-LDPC parity check matrix 900, column vector 906 is stored (from which circulant 904 can be reconstructed). In some embodiments, storing the location is more storage efficient for low density matrices. As a result, in some embodiments, the technique of storing a location is used for storing information associated with parity check matrices but not necessarily for generator matrices which tend to have higher densities. In some embodiments, if the number of 1's in a circulant (e.g., one of circulants $H_{i,j}$) is less than $b/(ceil(\log_2(b)))$, where b is the circulant size, then the location of 1's is stored. In some embodiments, this threshold is based on the assumption that the locations are stored in base 2 format.

In some embodiments, when there is relatively small number of 1's (e.g., in a row vector of the circulant), a non-base 2 format is used to store the location of the 1's. In one example, if the circulant size (i.e., b) is 12 then the valid locations of 1's would be (in decimal) 1 (i.e., there is a 1 in the first element of the vector), 2 (i.e., there is a 1 in the second element of the vector), . . . , 11 and 12. In binary (i.e., base 2), this would be 0001, 0010, . . . , 1011, and 1100. An example of a non-base 2 format is [6 3 2 1] which results in all 16 combinations of 0000 thru 1111 being mapped to 0 thru 12 (in decimal) when this [6 3 2 1] format is used. In some cases this is a many to one mapping (e.g., both 0100 and 0011 in this format will map to 3 in decimal). One benefit to using a non-base 2 format to store locations is a more efficient hardware design (e.g., when implemented as a field-programmable gate array (FPGA) or application-specific integrated circuit (ASIC)). For example, addressing the memory is made easier and there is less routing congestion. Another advantage is that a non-base 2 format can be used to avoid some or all out-of-bounds addresses. In the [6 3 2 1] example above, it is impossible to map to 13-15 in decimal and thus those out-of-bounds addresses (for this example where the circulant size b=12) cannot be accidentally accessed. In some embodiments, 0000 (e.g., in base 2 format or some non-base 2 format such as [6 3 2 1]) represents a special value: an all zero matrix or vector.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for processing quasi-cyclic low-density parity-check (QC-LDPC) data, comprising:
   a multiplexer configured to receive an input signal, which includes decision and reliability information corresponding to unpadded data, and introduce into the input signal decision and reliability information corresponding to padded data;
   a decoder configured to perform message passing one or more times to obtain decoded data, including by using (1) the decision and reliability information corresponding to the unpadded data and (2) the decision and reliability information corresponding to the padded data, including by giving preference to the decision and reliability information corresponding to the padded data over the decision and reliability information corresponding to the unpadded data during message passing; and
   a filter configured remove zero padding from the decoded data.

2. The system recited in claim 1, wherein the unpadded data is associated with data that is stored on storage and the unpadded data is associated with data that is not stored on the storage.

3. The system recited in claim 2 further comprising:
   a pad table configured to store information indentifying which locations on the storage are associated with, but do not contain, padded data; and
   a controller configured to access the pad table and determine, based at least in part on the stored information in the pad table, whether the input signal is associated with, but does not contain, padded data, wherein the signal injector, decoder and filter are configured to operate in the event it is determined the input signal is associated with, but does not contain, padded data.

4. The system recited in claim 2, wherein the storage includes one or more of the following: magnetic disk storage or Flash storage.

5. The system recited in claim 1, wherein message passing includes one or more of the following: sum product algorithm (SPA), minimum sum, scaled minimum sum, or offset minimum sum.

6. The system recited in claim 1 further comprising a soft output detector configured to generate the decision and reliability information corresponding to the unpadded data.

7. The system recited in claim 6, wherein the soft output detector includes a soft output Viterbi decoder.

8. The system recited in claim 1, wherein the generator matrix (G) includes a plurality of circulants ($G_{i,j}$) and storing the generator matrix includes storing, for at least one of the plurality of circulants, one and only one vector from said at least one of the plurality of circulants.

9. The system recited in claim 1, wherein the parity check matrix (H) includes a plurality of circulants ($H_{i,j}$) and storing the parity check matrix includes storing, for at least one of the plurality of circulants, one and only one vector from said at least one of the plurality of circulants.

10. The system recited in claim 1, wherein the parity check matrix (H) includes a plurality of circulants ($H_{i,j}$) and storing the parity check matrix includes storing, for at least one of the plurality of circulants, the location(s) of the 1's in one and only one vector from said at least one of the plurality of circulants.

11. The system recited in claim 10, wherein storing the location(s) of the 1's is performed in the event the number of 1's in the parity check matrix is less than $b/(ceil(\log_2(b)))$ where b is the circulant size.

12. The system recited in claim 10, wherein storing the location(s) of the 1's includes storing the location(s) in non base 2.

13. A method for processing quasi-cyclic low-density parity-check (QC-LDPC) data, comprising:
   receiving an input signal, which includes decision and reliability information corresponding to unpadded data;

introducing into the input signal decision and reliability information corresponding to padded data;

using a low-density parity-check (LDPC) decoder to perform message passing one or more times to obtain decoded data, including by using (1) the decision and reliability information corresponding to the unpadded data and (2) the decision and reliability information corresponding to the padded data, including by giving preference to the decision and reliability information corresponding to the padded data over the decision and reliability information corresponding to the unpadded data during message passing; and removing zero padding from the decoded data.

14. The method recited in claim 13, wherein the unpadded data is associated with data that is stored on storage and the unpadded data is associated with data that is not stored on the storage.

15. The method recited in claim 14 further comprising:
storing, in a pad table, information which indentifies which locations on the storage are associated with, but do not contain, padded data; and accessing the pad table and determining, based at least in part on the stored information in the pad table, whether the input signal is associated with, but does not contain, padded data, wherein the introducing, message passing and removing are configured to be performed in the event it is determined the input signal is associated with, but does not contain, padded data.

16. The method recited in claim 14, wherein the storage includes one or more of the following: magnetic disk storage or Flash storage.

17. The method recited in claim 13, wherein message passing includes one or more of the following: sum product algorithm (SPA), minimum sum, scaled minimum sum, or offset minimum sum.

18. The method recited in claim 13 further comprising using a soft output detector to generate the decision and reliability information corresponding to the unpadded data.

19. The method recited in claim 18, wherein the soft output detector includes a soft output Viterbi decoder.

20. A computer program product for processing quasi-cyclic low-density parity-check (QC-LDPC) data, the computer program product being embodied in a non-transitory computer readable storage medium and comprising computer instructions for:

receiving an input signal, which includes decision and reliability information corresponding to unpadded data;

introducing into the input signal decision and reliability information corresponding to padded data;

performing message passing one or more times to obtain decoded data, including by using (1) the decision and reliability information corresponding to the unpadded data and (2) the decision and reliability information corresponding to the padded data, including by giving preference to the decision and reliability information corresponding to the padded data over the decision and reliability information corresponding to the unpadded data during message passing; and removing zero padding from the decoded data.

* * * * *

UNITED STATES PATENT AND TRADEMARK OFFICE
CERTIFICATE OF CORRECTION

PATENT NO.         : 8,572,463 B2                                Page 1 of 1
APPLICATION NO.    : 13/035770
DATED              : October 29, 2013
INVENTOR(S)        : Zeng et al.

It is certified that error appears in the above-identified patent and that said Letters Patent is hereby corrected as shown below:

In the claims
In column 12, line 18, claim 3, delete "indentifying" and insert -- identifying --, therefor.
In column 13, line 19, claim 15, delete "indentifies" and insert -- identifies --, therefor.

Signed and Sealed this
Fifteenth Day of March, 2016

Michelle K. Lee
*Director of the United States Patent and Trademark Office*